US005521875A

United States Patent [19]
Callahan

[11] Patent Number: 5,521,875
[45] Date of Patent: May 28, 1996

[54] DYNAMIC SINGLE-ENDED SENSE AMP IMPROVEMENT WITH CHARGE SHARE ASSIST

[75] Inventor: John M. Callahan, Fremont, Calif.

[73] Assignee: VLSI Technology, Inc., San Jose, Calif.

[21] Appl. No.: 366,938

[22] Filed: Dec. 30, 1994

[51] Int. Cl.$^6$ .................................................. G11C 7/00
[52] U.S. Cl. .......................... 365/207; 365/203; 365/204; 365/208; 327/51
[58] Field of Search ..................................... 365/207, 208, 365/204, 203, 230.05; 327/51

[56] References Cited

U.S. PATENT DOCUMENTS 4,982,363  1/1991  Sood ............................. 327/51
5,424,995  6/1995  Miyazaki et al. .............. 365/230.05
5,426,385  6/1995  Lai ................................ 327/51 X Primary Examiner—A. Zarabian
Assistant Examiner—Son Dinh
Attorney, Agent, or Firm—Patrick T. King

[57] ABSTRACT

A synchronous sense amplifier stage includes means for shunting the signal input terminal of the sense amplifier stage to ground during a precharge interval for discharging charge on a read bit line connected to the input terminal of the synchronous sense amplifier during the precharge interval. Means are also provided for precharging predetermined internal nodes and the output terminal of the synchronous sense amplifier stage to predetermined voltages during the precharge interval.

2 Claims, 3 Drawing Sheets

DYNAMIC SINGLE-ENDED SENSE AMP IMPROVEMENT WITH CHARGE SHARE ASSIST

TECHNICAL FIELD

The present invention relates to improvements for sense amplifiers (sense amps) for random access memories (RAMS).

BACKGROUND OF THE INVENTION

A dual-port SRAM has one input port for writing data information into the memory device and a second output port for reading data information out of the memory device. A dual-port configuration allows asynchronous reading and writing operations to be performed at the same time. The memory cells of an SRAM are arranged as columns and rows. For writing a data information bit into a particular memory cell a write bit line provides the information bit to an entire column of memory cells. A particular one of the memory cells in the column is selected for storing the information bit with a row selection signal provided on a write word line. For reading the contents of a particular memory cell, the particular memory cell in a column is selected for reading with a row selection signal provided on a read word line.

The overall performance of a dual-port RAM integrated-circuit device is often limited by the performance of the sense amplifiers and column selection circuits which are used to sense the charge stored in a particular memory cell. To obtain improvements in read times for a given memory cell design, the speed of the sense amplifiers must be improved. As higher speeds are demanded, RAM device architectures need to be redesigned to meet 140–200 MHz read access time requirements without changing the design of the actual memory cells. Designers of integrated-circuit memory devices continue to make memory cells and their associated multiplexing transistors smaller and smaller as the number of bits in the memory devices continue to increase. This means that the resistance of memory cells and their associated addressing circuits continue to increase so that switching time constants also tend to increase.

As higher operating speeds are required in SRAM memory designs, a problem arises. The problem is that the rates of charging and discharging the read bit lines of SRAM memory devices are limited. This is because the read bit lines are series connected from high-resistance memory cells through high-resistance Y MUX transistors to sense amps, which are typically passive receivers and which do not supply any charge to assist the bit line. Some synchronous, or clocked, sense amps do provide some assistance when HIGH bits in memory cells are being sensed. Problems with sensing LOW bits in the memory cells limit the frequency response of such memory devices.

SUMMARY OF THE INVENTION

It is, therefore, an object of the present invention to provide a synchronous sense amp for an SRAM with improved frequency response.

In accordance with this and other objects of the invention a solution is provided for improving the speed performance of a dual-port static random access memory (SRAM) integrated-circuit device. According to the invention, the input terminal to a synchronous sense amp is set to ZERO during the precharge time interval, while the unaddressed column line is allowed to charge to VCC-Vt. During the pre-charge time, when the Y MUX signals and read word line are addressing the bit column and are connecting a memory cell with a ZERO state to the sense amp, the bit line charged to VCC-Vt is connected through the Y MUX transistors to the input terminal of the sense amp which is being set to ZERO. The result is that even through the bit line is charged to VCC-Vt, the total charge to be removed from the read bit line is reduced so that the sense amp can react faster and the read time for ZERO bits stored in a memory cell is significantly improved.

A sense amplifier for an SRAM according to the invention includes a synchronous sense amplifier stage for sensing the state of a memory cell and for providing an output signal indicative of the state of a particular memory cell. The sense amp has a pre-charge signal input terminal at which is provided a pre-charge signal during a precharge interval for the synchronous sense amplifier. Means are provided for shunting the signal input terminal of the sense amplifier stage to ground during the precharge interval and for discharging charge on the input terminal of the synchronous sense amplifier during the precharge mode. Means are provided which are responsive to the pre-charge signal for precharging predetermined nodes of the sense amplifier stage to predetermined voltages during the precharge interval. The sense amp also includes multiplexed switching means for selectively connecting a read bit line to the signal input terminal of the sense amplifier stage. Word line means are also provided for selectively connecting an output terminal of one of the memory cells of a bit column to the read bit line;

A synchronous sense amplifier system is provided for use with bit columns of an SRAM, said bit columns which have number of memory cells for storing memory bits and which have addressing circuits for addressing the memory cells. The synchronous sense amplifier operates alternately in a precharge mode and in a memory-bit acquisition mode. A sense amplifier stage is provided with a pre-charge signal during a precharge interval for the synchronous sense amplifier. Multiplexed switching means selectively connecting the read bit line to the signal input terminal of the sense amplifier stage. The invention includes means for shunting the signal input terminal of the sense amplifier stage to ground during the precharge interval and for discharging charge on the read bit line during the precharge mode. The sense amplifier stage includes a three-terminal switching transistor which has one terminal charged to a positive charge so that during the memory-bit acquisition mode it is switched to provide positive charge to the input terminal of the sense amp.

A method is provided according to the invention for sensing the state of memory cells in an SRAM. The method includes the steps of: sensing the state of a memory cell with a synchronous sense amplifier stage; and discharging charge on the input terminal of the synchronous sense amplifier during the precharge mode. The method further includes the step of precharging predetermined nodes of the sense amplifier stage to predetermined voltages during the precharge interval. The step of discharging charge on the input terminal of the synchronous sense amplifier during the precharge mode includes the step of shunting a signal input terminal of the sense amplifier stage to ground during the precharge interval, A method is also provided for sensing the state of memory cells in the bit columns of an SRAM with a synchronous sense amplifier, The method includes the steps of, selectively connecting an output terminal of one of the memory cells of a bit column to a read bit line for a number of memory cells; operating a synchronous sense amplifier stage alternately in a precharge mode and in a memory-bit acquisition mode; selectively connecting the read bit line to the signal input terminal of the sense amplifier stage with a multiplexed switching means; sensing the state of a memory cell with the synchronous sense amplifier stage; shunting the signal input terminal of the sense amplifier stage to ground during the precharge interval and discharging charge on the read bit line during the precharge mode, The method also includes the steps of precharging predetermined nodes of the sense amplifier stage to predetermined voltages during the precharge interval and setting the output terminal of the sense amplifier stage to a predetermined voltage level. The step of precharging predetermined nodes of the sense amplifier stage includes charging an internal node of said sense amplifier stage to a positive charge and turning on a switch transistor to provide the positive charge to the input terminal of the sense amp.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
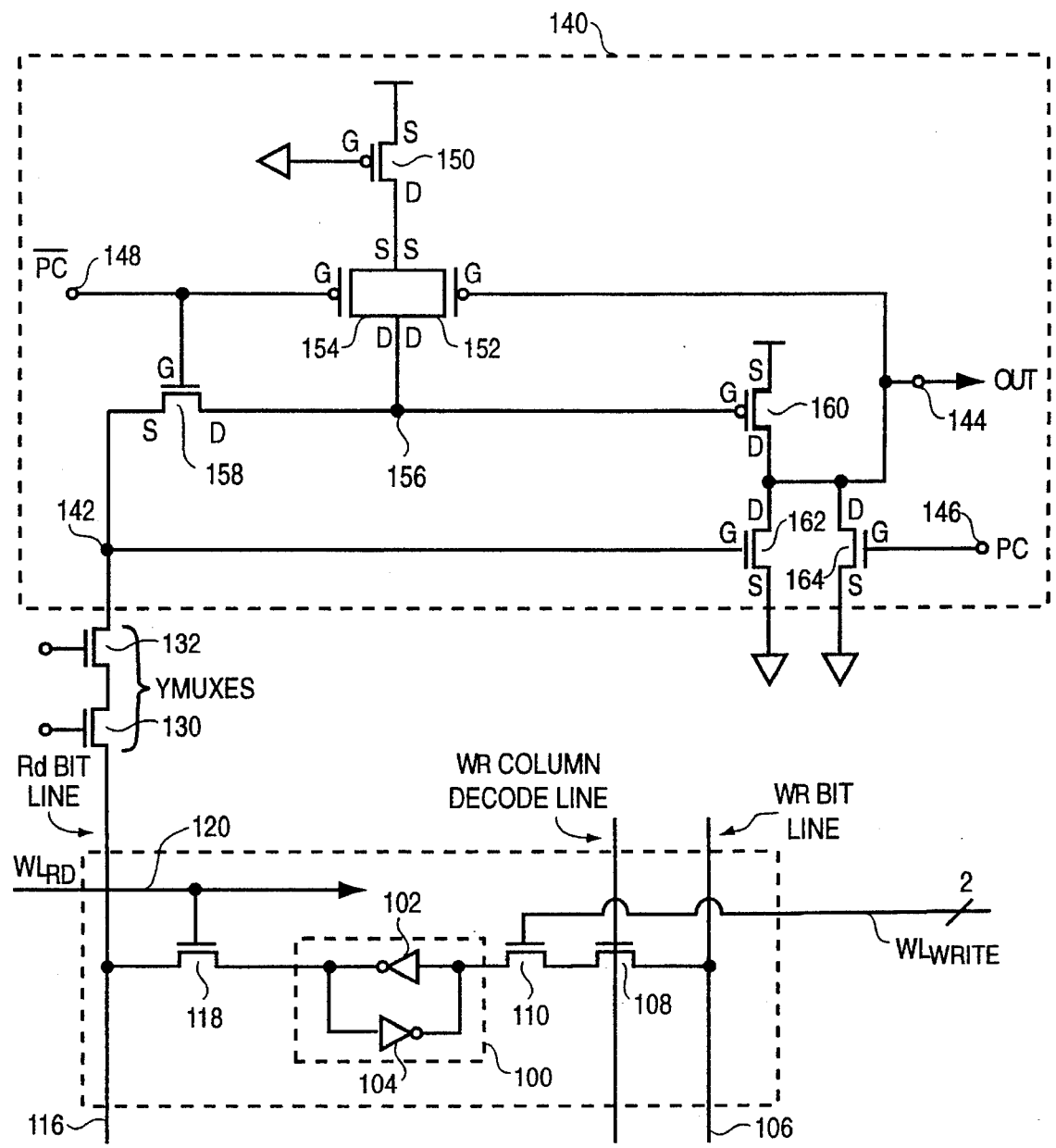
FIG. 1 is a circuit diagram of a prior art RAM which has a memory cell connected to a sense amplifier through a pair of Y MUX series transistors.

FIG. 1 is a circuit diagram of one memory cell and its associated read circuitry for a dual-port static random access memory (SRAM) integrated-circuit device. A typical memory cell 100 of an SRAM includes a first inverter 102 which is cross-connected to a weaker, higher resistance, second inverter 104. The output terminal of the first inverter 102 is connected to the input terminal of the second inverter 104. The output terminal of the second inverter is connected to the input terminal of the first inverter. A signal at the input terminal of the first inverter 102 overcomes the output signal of the second weaker inverter to change the state of the first inverter 102. The second inverter provides feedback to latch the state of the first inverter.

A WR Bit Line 106 is connected to one end of a pair of series-connected transistors 108, 110. The respective gate terminals of the transistors 108, 110 are connected to respective output terminals of a write column decoder circuit which provides word line and column write signals. These signals activate the series-connected transistors 108, 110 to connect the WR Bit Line 106 to the input terminal of the first inverter 102. The first inverter 102 stores the signal level of the WR Bit Line 106 in the memory cell provided by the first inverter 102 and the cross-connected weaker second inverter 104.

A read RD Bit Line 116 is connected to the memory cell through a series-connected wordline series NMOS gate transistor 118. The gate terminal of the transistor 118 is connected through a signal line 120 to an output terminal of a READ ROW decoder circuit which provides the WORD LINE READ ($WL_{rd}$) signal. The $WL_{rd}$ signal connects the output terminal of the first inverter 102 to the RD Bit Line 116 to provide an inverted output signal indicative of the contents of the memory cell.

In the read mode of operation, two series-connected Y MUX transistors 130, 132 are turned on by having respective first and second Y MUX signals applied to their gate terminals. The two series-connected Y MUX transistors 130, 132 connect the RD Bit Line 116 to an input terminal 142 of a synchronous sense amplifier 140. The function of a sense amp is to determine the state of a selected memory cell and to provide an output signal indicative thereof.

The RD Bit Line 116 has an equivalent capacitance, for example, of 0.3 picofarads. The combination of a high cell resistance and the RD Bit Line capacitance causes a signal on the RD Bit Line 116 to change slowly if the only source or sink of charge is a high-resistance memory cell. Sense amps are used to determine the state of a selected memory cell and to provide an output signal indicative thereof. Sense amps are sometimes also used to assist a memory cell by driving charge onto the RD Bit Line.

An example of a synchronous (clocked) sense amplifier (sense amp) is the sense amp 140. Sense amp 140 supplies charge to the RD Bit Line 116 to assist the pullup of the memory cell 100 in the charging of the RD Bit Line 116 from a LOW state to a HIGH state. When going from a zero-volt logical LOW state to a ($V_{DD}$-$V_T$) logical HIGH state, the line 116 thus has two sources of charge, namely the memory cell 100 and the sense amp 140.

The sense amplifier 140 has an input terminal 142 with an equivalent capacitance of 0.05 picofarads. The sense amp provides an output signal at an output terminal 144.

The sense amplifier 140 is a synchronous sense amplifier which means that it is clocked by a precharge signal PC, which is applied at a PC terminal 146 and by an inverted precharge signal PC* which is applied at a PC* terminal 148.

The sense amp 140 includes a PMOS load transistor 150 which has a source terminal connected to a $V_{DD}$ voltage source and a gate terminal connected to a ground voltage source to turn on the PMOS transistor 150. The drain terminal of the PMOS transistor 150 is connected to the source terminals of two other PMOS transistors 152, 154. The drain terminals of the two other PMOS transistors 152, 154 are also connected together at a terminal 156.

A source terminal of an NMOS transistor 158 is connected to the input terminal 142 of the sense amp 140. The gate terminal of the NMOS transistor 158 is connected to the gate terminal of the PMOS transistor 154 and also to the PC* input terminal 148.

The gate terminal of a PMOS transistor 160 is connected to terminal 156. The source terminal of the PMOS transistor 160 is connected to the VDD voltage reference source. The drain terminal of the PMOS transistor 160 is connected to the output terminal 144. The drain terminal of the PMOS transistor 160 is connected to the drain terminal of an NMOS transistor 162, which has a source terminal connected to the ground reference voltage. The gate terminal of the NMOS transistor 162 is connected to the input terminal 142 of the sense amp 140.

The drain terminal of an NMOS transistor 164 is connected to the output terminal 144 of the sense amp 140 and also to the drain terminals of the NMOS transistor 162. The source terminal of the NMOS transistor 164 is connected to the ground reference voltage. The gate terminal of the NMOS transistor 164 is connected to the PC terminal 146.

The sense amp 140 has two alternating modes of operation. One is the precharge mode during which various nodes of the sense amp are charged or discharged in anticipation of the data to be sensed from a memory cell. The other mode is the evaluation mode in which the sense amp actually makes a determination of the data stored in a memory cell.

During precharge the address lines and Y MUX signals of the memory device are being set up to address a particular memory cell. During precharge the sense amp 140 operates as follows: The PC signal is HIGH and the inverted PC signal (PC*) is LOW. The NMOS transistor 164 is turned on, which grounds the output terminal 144 to a LOW level, providing a LOW precharged state on the output terminal 144. The LOW level on the gate terminal of the PMOS transistor 152 turns on the PMOS transistor 152. The PC* signal at terminal 148 turns on the other PMOS transistor 154. This provides a HIGH pre-charge state on terminal 156, which will assist in sensing a HIGH state to be read from a memory cell.

When precharge ends, the evaluation mode starts. The PC signal goes to ZERO state and the PC* signal goes to a HIGH state. The NMOS transistor 158 turns on and the PMOS transistor 152 remains on. Charge flows through transistors 152 and 156 to the input terminal 142 and through the Y MUX transistors 130, 132 to the Rd Bit Line 116.

If the memory cell is putting out a ONE, or HIGH, level, the input terminal 142 eventually charges up to a point where the PMOS transistor 160 is turned off, the NMOS transistor 162 is turned on, and the PMOS transistor 152 remains on. This occurs so fast that the output terminal stays at the precharged ZERO level.

If the memory cell being addressed is putting out a ZERO level, terminal 156 drops and the NMOS transistor 162 does not turn on. The PMOS transistor 160 turns on and the output voltage at terminal 144 rises to a HIGH state.

A favored transition for the sense amp 140 occurs when the bit line 116 is to be charged up from the zero-volt LOW state to the HIGH state. For this condition, charge flows through the NMOS transistor 158 from the precharged HIGH terminal 156 and through the PMOS transistor 152.

A less favored transition occurs when the bit line 116 has to be discharged, or fall, from the HIGH state without assistance of the sense amp 140. In this case, the charge is removed from line 116 and the input terminal 142 has to go through the wordline and the high-resistive series NMOS gate transistor 118 and the high-resistance of the memory cell. The sense amp provides no assistance in this case.

A subtle and perhaps unrecognized worst case for this less favored transition occurs when the bit line has not been addressed for a few cycles of the Y MUX operation and the memory cells connected to this bit line all put out a HIGH level. In this case, the bit line 116 is fully charged up to a HIGH voltage level equal to VDD-Vt. The line 116 in a fully charged condition is then connected to the sense amp 116 through the Y MUX transistors 130, 132 while the particular memory cell being addressed is putting out a zero-volt signal. In this situation, all of the charge on the equivalent capacitance of the bit line and the input of the sense amp has to be discharged through the high resistance of the memory cell 100 and the Y MUX transistors. In this case the memory device is slowed considerably and may fail to meet a high frequency operation specification because the worst case discharge from a fully-charged level to a zero-volt level can take as much as 4.7 nanoseconds.

It should be appreciated that the sense amp 140 has a serious performance problem, which needs to be rectified to meet performance specifications at clock rates of 140–200 MHz.

One approach to discharging a fully charged read bit line to ground is to use a transistor during the precharge time to ground each bit line, so that the charge on the read bit line could not build up to VCC-Vt. This effectively removes the problem but introduces another problem, which is increased power consumption. If the memory cell connected to the bit line during precharge is putting out a ONE level, there will be charge drawn from the memory cell by the precharge device. The worst case for this is 466 microamps. A worst-case RAM configuration having 1024 columns would consume power equal to (466 microamps)×(55 percent duty cycle)×(1024) ×.(3.6 volts), or 945 milliwatts. Use of such a discharge transistor would consume a unacceptable amount of power in an integrated-circuit memory device.

Figure 2:
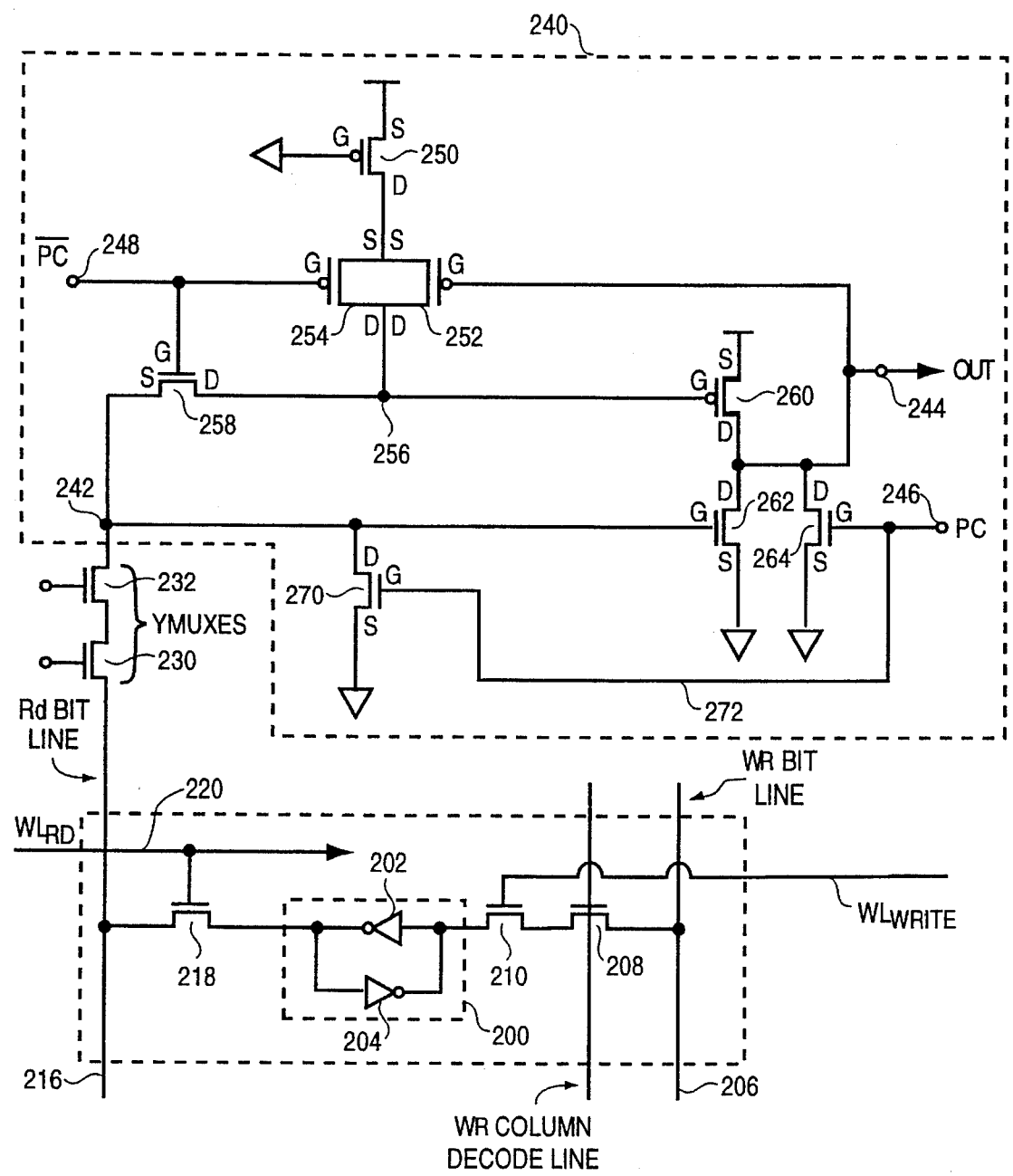
FIG. 2 is a circuit diagram of a RAM memory cell, Y MUX series transistors, and a sense amplifier according to the invention.

FIG. 2 shows a more elegant solution for a dual-port static random access memory (SRAM) integrated-circuit device according to the invention. In this approach, the input terminal to a synchronous sense amp is set to ZERO during the pre-charge time interval, while the unaddressed column line is allowed to charge to VCC-Vt. During the pre-charge time, when the Y MUX signals and read word line address the column and connect a memory cell with a ZERO state to the sense amp, the bit line charged to VCC-Vt is connected though the Y MUX transistors to the input terminal of the sense amp which is being set to ZERO. The result is that even through the bit line is charged to VCC-Vt, the total charge to be removed from the read bit line is reduced so that the sense amp can react faster and the read time for ZERO bits stored in a memory cell is significantly improved.

A typical memory cell 200 of an SRAM includes a first inverter 202 which is cross-connected to a weaker, higher resistance, second inverter 204. A WR Bit Line 206 is connected to one end of a pair of series-connected transistors 208, 210. The respective gate terminals of the transistors 208, 210 are connected to respective output terminals of a write column decoder circuit which provides word line and column write signals. These signals activate the series-connected transistors 208, 210 to connect the WR Bit Line 206 to the input terminal of the first inverter 202 of the memory cell 200.

A read RD Bit Line 216 is connected to the memory cell through a series-connected wordline series NMOS gate transistor 218. The gate terminal of the transistor 218 is connected through a signal line 220 to an output terminal of a read row decoder circuit which provides the WORD LINE READ ($WL_{rd}$) signal The $WL_{rd}$ signal connects the output terminal of the first inverter 202 to the RD Bit Line 216 to provide an inverted output signal indicative of the contents of the memory cell.

In the read mode of operation, two series-connected Y MUX transistors 230, 232 are turned on by having respective first and second Y MUX signals applied to their gate terminals. The two series-connected Y MUX transistors 230, 232 connect the RD Bit Line 216 to an input terminal 242 of a synchronous sense amplifier 240, which determines the state of a selected memory cell and provides an output signal indicative thereof. The output signal of the sense amp is inverted. An inverter is used to invert the output signal of the sense amp prior to it being latched into an output register.

The RD Bit Line 216 has an equivalent capacitance, for example, of 0.3 picofarads and the input terminal 242 of the sense amp has an equivalent capacitance of 0.05 picofarads. As before, the synchronous sense amplifier 240 supplies charge to the RD Bit Line 216 to assist the pullup of the memory cell 200 in charging bit line 216 from a LOW state to a HIGH state. When going from a zero-volt logical LOW state to a ($V_{DD}$-$V_T$) volt logical HIGH state, the line 216 thus has two sources of charge, namely the memory cell 200 and the sense amp 240. It will be seen that the sense amp 240, according to the invention, also provides for transfer of a LOW memory-cell state to the output of the sense amp 240 to solve the problem discussed in connection with the circuit of FIG. 1, where a fully charged RD Bit Line 216 suddenly has a memory cell with a zero output state connected to the RD Bit Line 216.

The sense amplifier 240 has an input terminal 242 with an equivalent capacitance of 0.05 picofarads. The sense amp provides an output signal at an output terminal 244. The synchronous sense amplifier 240 is clocked by a precharge signal PC applied at a PC terminal 246 and by an inverted precharge signal PC* applied at a PC* terminal 248.

The sense amp 240 includes a PMOS load transistor 250 which has a source terminal connected to a $V_{DD}$ voltage source and a gate terminal connected to a ground voltage source to turn on the PMOS transistor 250. The drain terminal of the PMOS transistor 250 is connected to the source terminals of two other PMOS transistors 252, 254. The drain terminals of the two other PMOS transistors 252, 254 are also connected together at a terminal 256.

A source terminal of an NMOS transistor 258 is connected to the input terminal 242 of the sense amp 240. The gate terminal of the NMOS transistor 258 is connected to the gate terminal of the PMOS transistor 254 and also to the PC* input terminal 248.

The gate terminal of a PMOS transistor 260 is connected to terminal 256. The source terminal of the PMOS transistor 260 is connected to the VDD voltage reference source. The drain terminal of the PMOS transistor 260 is connected to the output terminal 244. The drain terminal of the PMOS transistor 260 is connected to the drain terminal of an NMOS transistor 262, which has a source terminal connected to the ground reference voltage. The gate terminal of the NMOS transistor 262 is connected to the input terminal 242 of the sense amp 240.

The drain terminal of an NMOS transistor 264 is connected to the output terminal 244 of the sense amp 240 and also to the drain terminals of the NMOS transistor 262. The source terminal of the NMOS transistor 264 is connected to the ground reference voltage. The gate terminal of the NMOS transistor 264 is connected to the PC terminal 246.

A drain terminal of an NMOS transistor 270 is connected to the input terminal 242 of the sense amp 240. The source terminal of the NMOS transistor 270 is connected to ground. The gate terminal of the NMOS transistor 270 is connected through a signal line 272 to the PC terminal 246.

As previously mentioned, a synchronous sense amp has two alternating modes of operation as determined by the phases of a clock signal for the memory device. One mode is the precharge mode during which various nodes of the sense amp are charged or discharged in anticipation of the data to be sensed from a memory cell. The other mode is the evaluation mode in which the sense amp actually makes a determination of the data stored in a memory cell.

The sense amp 240 during precharge operates as follows: During precharge, the PC signal at terminal 246 is HIGH and the NMOS transistor 270 is turned on which grounds the input terminal 242. Grounding of the input terminal 242 discharges any charge on the input terminal of the sense amp 240 and the Rd Bit Line 216 through the Y MUX transistors 230, 232. This arrangement avoids the problem associated with the less favored transition previously discussed, which occurs when the bit line 216 has to be discharged, or fall, from a fully charged condition to accommodate a ZERO state of a selected memory cell. This arrangement is particularly useful for the previously-discussed more subtle and previously unrecognized worst case which occurs when the bit line has not been addressed for a few cycles of the Y MUX operation and the memory cells connected through the Y MUX puts out a ONE level to fully charge up the bit line 216 a HIGH voltage level equal to VDD-Vt. The line 216 in a fully charged condition is then connected to the sense amp 240 through the Y MUX transistors 230, 232 while the particular memory cell being addressed puts out a zero-volt signal. In this situation, all of the charge on the equivalent capacitance from the bit line to the input of the sense amp is discharged through the series Y MUX transistors and the shunt NMOS transistor 270.

During precharge, the NMOS transistor 264 is turned on, which grounds the output terminal 244 to a ZERO level to provide a ZERO precharged state on terminal 244. The ZERO level on the gate terminal of the PMOS transistor 252 turns on the PMOS transistor 252. The PC* signal at terminal 248 turns on the other PMOS transistor 254. This provides a HIGH pre-charge state on terminal 256.

When precharge ends and the evaluation mode starts, the PC signal goes to ZERO state and the PC* signal goes to a HIGH state. The shunt NMOS transistor 270 turns off to remove the ground connection to the input terminal 242 of the sense amp 240. The NMOS transistor 258 turns on and the PMOS transistor 252 remains on. Charge flows through transistors 252 and 258 to the input terminal 242 and to the bit line through the Y MUX transistors 230, 232.

If the memory cell is putting out a ONE, or HIGH, level, terminal 242 charges up to a point where PMOS transistor 260 is turned off, NMOS transistor 262 is turned on, and PMOS transistor 252 remains on. This occurs so fast that the output terminal stays at the precharged ZERO level.

If the memory cell is putting out a ZERO, terminal 256 drops and the NMOS transistor 262 does not turn on. After terminal 256 discharges sufficiently, the PMOS transistor 260 eventually turns on and the output voltage at terminal 244 rises to a HIGH state.

A favored transition for the sense amp 240 occurs when the bit line 216 is to be used to transfer a HIGH bit from a selected memory cell.

A less favored transition previously occurred when the bit line 216 had to be discharged, or fall, from the HIGH state to accommodate a ZERO memory-cell state. As discussed previously, it was discovered that this transition was particularly unfavorable When the read bit line had not been addressed for a few cycles of the Y MUX operation and the memory cells linked to this bit line were all putting out ONE levels. In this situation, all of the charge on the equivalent capacitance from the bit line to the input of the sense amp had to be discharged through the high resistance of the memory cell 200 and the Y MUX transistors.

For this case, the sense amp 240 according to the present invention, is aided by the shunt NMOS transistor 270 discharging the charge on the input terminal 242 of the sense amp and discharging the Rd Bit Line 216 through the Y MUX transistors during the pre-charge portion of a clock cycle. Using the shunt transistor 270 during precharge has provided significant performance improvements.

Figure 3:
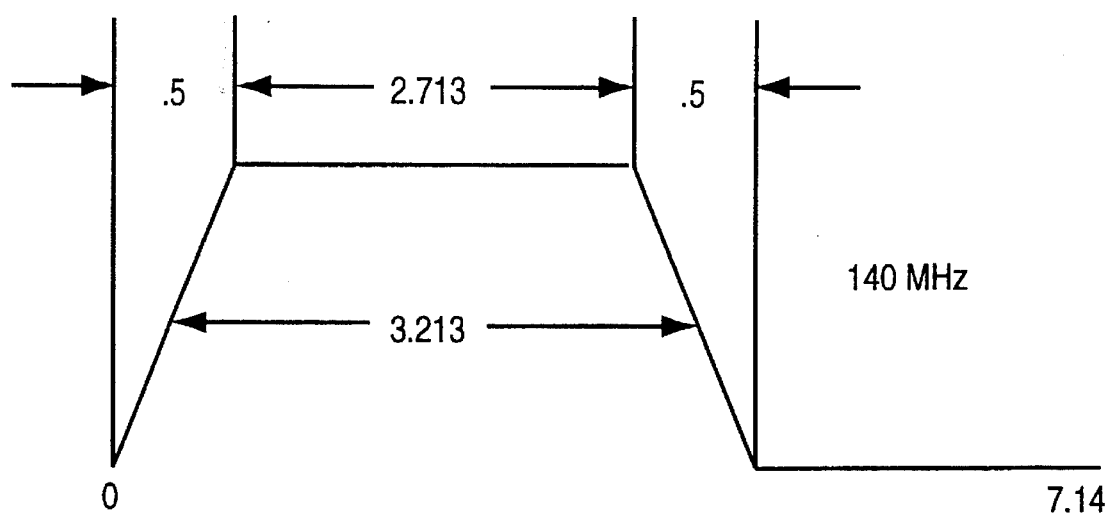
FIG. 3 is a timing diagram showing the times required for operating a RAM at 140 MHz.

FIG. 3 is a timing diagram which shows the clock signal for PC* for operation of the sense amp 240 at 140 MHz with a 45 percent duty cycle. When the PC* signal is HIGH, the sense amp 240 is in the evaluation mode of operation. When the PC* signal is LOW, the sense amp 240 is in the precharge mode of operation. The diagram shows that 3.213 nanoseconds is allocated for the evaluation phase. This is the time from the halfway point in the rise of the PC* signal to the dropping of the node at the input terminal of an output register connected through an inverter to the output terminal 244 of the sense amp 240.

A sense amp with the shunt NMOS transistor 270 was simulated for the worst-case charge condition on RD Bit line 216 and resulted in a time of 2.554 nanoseconds. A sense amp without the shunt NMOS transistor 270 for the worst case charge condition on read bit line 216 has a simulated time of 4.744 nanoseconds. The invention provides a 46 percent improvement and meets the requirement of less than 3.213 nanoseconds at 140 MHz.

An alternative was mentioned herein above of using a transistor during the precharge time to ground each read bit line so that the charge on the read bit line could not build up to VCC-Vt. This alternative would effectively removes the problem but would introduces another problem of increased power consumption. Note that the power consumed during precharge is considerably reduced with the sense amp 240 according to the invention, especially in comparison with the previously discussed alternative. Using 466 microamps per sense amp, the worst case RAM configuration uses 70 such sense amps so that the power consumed equals (466 microamps)×(55 percent duty cycle)×(70)×(3.6), or 65 milliwatts. This represents a 93 percent reduction from a memory device using a pulldown transistor on each Rd Bit Line.

It should be appreciated that with an improved sense amp according to the invention, memory cell size does not have to be increased to get greater speed, which is an important consideration for the design of single-ended RAM sense amp designs.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A synchronous sense amplifier system for use with bit columns of an SRAM, said bit columns including a number of memory cells for storing memory bits and addressing circuits for addressing said memory cells, said synchronous sense amplifier operating alternately in a precharge mode and in a memory-bit acquisition mode, comprising:

a.) a read bit line for a number of memory cells;

b.) word line means for selectively connecting an output terminal of one of the memory cells of a bit column to the read bit line;

c.) a sense amplifier stage for sensing the state of a memory cell, said sense amplifier stage having;
  i.) a signal input terminal;
  i) an output terminal for providing an output signal indicative of the state of a particular memory cell;
  ii) a pre-charge signal input terminal at which is provided a pre-charge signal during a precharge interval for the synchronous sense amplifier;
  ii) a three-terminal switching transistor having a first terminal connected to the input terminal of the sense amplifier stage, a second terminal connected to an internal node of said sense amplifier stage, and a third terminal connected to an inverted precharge signal level wherein the means for precharging predetermined nodes of the sense amplifier stage includes means for charging the internal node of said sense amplifier stage to a positive charge and wherein the three-terminal switching transistor includes a control terminal at which is provided a signal during the memory-bit acquisition mode to turn on the switch transistor to provide the positive charge to the input terminal of the sense amp:

d.) multiplexed switching means for selectively connecting the read bit line to the signal input terminal of the sense amplifier stage;

e.) means for shunting the signal input terminal of the sense amplifier stage to ground during the precharge interval and for discharging charge on the read bit line during the precharge mode.

2. A method of sensing the state of memory cells in an SRAM, comprising the steps of:

a. sensing the state of a memory cell with a synchronous sense amplifier stage; and b. discharging charge on the input terminal of the synchronous sense amplifier during a precharge mode by shunting a signal input terminal of the sense amplifier stage to ground during a precharge interval;

c. precharging predetermined nodes of the sense amplifier stage to predetermined voltages during the precharge interval including setting the output terminal of the sense amplifier stage to a predetermined voltage level;

d. selectively connecting a read bit line to the signal input terminal of the sense amplifier stage with a multiplexed switching means;

e. selectively connecting an output terminal of one of the memory cells of a bit column to the read bit line;

f. turning on a switch transistor to provide positive charge to the input terminal of the sense amp where said switch transistor is a three-terminal switching transistor having a first terminal connected to the input terminal of the sense amplifier stage a second terminal connected to an internal node of said sense amplifier stage, and a third terminal connected to an inverted precharge signal level wherein the means for precharging predetermined nodes of the sense amplifier stage includes means for charging the internal node of said sense amplifier stage to a positive charge and wherein the three-terminal switching transistor includes a control terminal at which is provided a signal during the memory-bit acquisition mode to turn on the switch transistor to provide the positive charge to the input terminal of the sense amp.

* * * * *